United States Patent Office 3,796,602
Patented Mar. 12, 1974

3,796,602

PROCESS FOR STRIPPING POLYMER MASKS FROM CIRCUIT BOARDS

Gary Clark Briney, Red Bank, and John Lester William Jones, New Shrewsbury, N.J., assignors to E. I. du Pont de Nemours and Company, Wilmington, Del.

No Drawing. Filed Feb. 7, 1972, Ser. No. 224,302
Int. Cl. B08b *3/08*; C11d *3/20*
U.S. Cl. 134—38 10 Claims

ABSTRACT OF THE DISCLOSURE

Photohardened resist masks are stripped from substrate surfaces, particularly metal surfaces of printed circuit boards, using an aqueous stripping liquid heated to near its phase transition temperature, the composition containing from 1 to 50% of a partially miscible organic solvent. The concentration and temperature are adjusted so that the liquid is at or near its phase transition from a single solution to two conjugate solutions. By this process resist masks normally stripped with organic solvents can be rapidly stripped with more economical and less hazardous aqueous liquids.

BACKGROUND OF THE INVENTION

Field of the invention

This invention relates to a process of removing polymer coating from substrates. More particularly it relates to a process of stripping polymer coatings from inorganic substrates using aqueous-organic solvent solutions at elevated temperatures. Still more particularly, it relates to removing polymer resist images from metallic and ceramic surfaces such as printed circuit boards using aqueous-organic soutions heated to critical temperatures.

Description of prior art

Polymer masks prepared from photosensitive materials such as described for example in Celeste U.S. Pats. 3,469,-982 and 3,526,504, and Hurley et al. 3,622,334 are normally stripped with organic solvents after the conventional operations of plating, etching, etc. are completed. The use of such solvents to strip photoresists is frequently expensive and inconvenient in that precautions are needed to eliminate fire and toxic hazards to the operator as well as to the environment. Attempts to obviate the need for solvent by the use of aqueous strippers with such polymers have required highly caustic stripping solutions to saponify the polymeric resist.

SUMMARY OF THE INVENTION

It is the object of this invention to provide a process for removing organic solvent strippable photopolymer masks using aqueous stripping liquids containing a minimal amount of a partially miscible organic solvent in order to reduce fire, toxic, and ecological hazards normally associated with organic solvents and to provide a process operable without the need for a highly caustic stripping bath.

The invention is a process of removing an organic solvent strippable polymer or colloid layer from a substrate comprising treating the layer with an aqueous stripping liquid containing between about 1 and 50% by weight of at least one partially miscible organic solvent, the aqueous liquid being at an elevated temperature, the organic solvent concentration and the elevated temperature being about the concentration and temperature of the phase transition at which the aqueous liquid passes from a single solution phase to two conjugate solution phases.

The invention more particularly comprises the process of removing from a substrate a mask of organic solvent strippable photohardened material adhered thereto which comprises soaking the substrate with the mask adhered thereto in an aqueous stripping liquid, preferably comprising between 2 and 25% by weight of at least one partially miscible organic solvent, the aqueous stripping composition being at an elevated temperature of at least 120° F., the organic solvent concentration and elevated temperature being within about 5% by weight of the organic solvent concentration and 20° F. of the temperature of phase transition at which the liquid passes from a single solution phase to two conjugate solution phases; and then removing the mask from the substrate, e.g., by scrubbing the mask and substrate with hot water or aqueous stripping composition.

By the process of the invention it is possible to process organic solvent strippable photoresists, i.e., those which cannot ordinarily be stripped from their substrates by aqueous solutions, with organic solvents incorporated in an aqueous liquid. Organic solvents useful for this purpose are organic liquids which are partially miscible in water and which, when undiluted, can either dissolve or swell the mask of photohardened material.

DESCRIPTION OF THE PREFERRED EMBODIMENTS

Aqueous stripping compositions useful in the invention are comprised of water as the major ingredient and at least one organic solvent which is partially miscible in water. Such compositions relate to aqueous liquid systems that are generally solutions at both very low and very high concentrations of organic solvent but at intermediate concentrations, two liquid phases, or conjugate solutions, can form when the temperature is suitably adjusted. The conjugate solutions which comprise the two phases, have the same vapor pressure and while the one conjugate solution has a low concentration of organic solvent, the other solution has a high organic solvent concentration. Aqueous compositions particularly useful in the invention are solutions at room temperature but which form two phases at intermediate compositions when the temperature is raised. Such aqueous compositions are members of liquid systems which have a lower consolute temperature, which is the minimum temperature at which two phases can form. Also useful in the invention are organo-aqueous compositions which comprise two phases of conjugate solutions at room temperature but which form a single solution at elevated temperatures. Such aqueous compositions are members of liquid systems which have an upper consolute temperature, which is the maximum temperature at which two phases can form. Aqueous compositions comprised of two phases at intermediate concentrations but apparently having neither an upper or a lower consolute temperature may be useful in the invention if a change in temperature or concentration can induce the formation of a single solution.

The aqueous stripping composition contains at least one organic solvent and may contain two or more organic solvents. It may also contain an alkaline agent and in some cases an acidic agent. The total concentration or organic solvents, however, should be between 1 and 50%, preferably between 2 and 25% by weight. In either event, especially preferred compositions are those between the composition identified by the consolute temperature and the composition with lowest organic solvent content which is capable of forming two liquid phases upon temperature change. Other useful but optional ingredients include buffering agents, and wetting agents or surfactants which make it possible for the aqueous composition to have improved contact with the polymer mask to be stripped and reduce buildup of solid residue.

The aqueous stripping composition is used at an elevated temperature near that at which the solution is transformed into two liquid solution phases. Unexpectedly, near this temperature, the apparent single solution is particularly useful for stripping polymer masks. The precise temperature at which a single solution phase is transformed into two liquid solution phases is generally unresolved and is dependent to some extent on atmospheric pressure and mutual solubilities of third components. Consequently for the purpose of defining the invention, this temperature will include in its meaning the unresolved range normally associated with such measurements and herein is designated phase transition temperature. For the purpose of this invention the phase transition temperature can be determined from the observed temperature at which the clear solution consisting of the aqueous stripping composition becomes cloudy or turbid or separates into two liquid phases, and from the observed temperature at which the turbid composition becomes clear or a single solution reforms. By averaging the two observed temperatures a phase transition temperature can be obtained. The precise concentration of organic solvent at which a single solution phase at a given temperature is transformed into two liquid solution phases is also generally unresolved. Consequently for the purpose of defining this invention this phase transition concentration will include in its meaning the unresolved range normally associated with its measurement. The phase transition concentration can be determined by adjusting the concentration at a given temperature with organic solvent or water.

Although heated single solution phase compositions near the phase transition region are preferred, the heated cloudy or turbid compositions near the phase transition are also particularly useful in the process of the invention. The heated turbid compositions in this region are believed to be essentially stable suspensions of the two heated conjugate solutions and generally are distinguished from heated two phase compositions in which the phases separate into two distinct layers or zones. Such "oiling out" can create secondary problems such as scumming and dye extraction from sloughed-off resist masks. The organic solvent concentration, therefore, at which the aqueous composition is useful in the invention is near to or within 5% by weight of the phase transition concentration. Similarly, the temperature at which the aqueous stripping liquid is useful in the invention is near to or within about 10 to 20° F. of the phase transition temperature at which the single solution phase is transformed into two liquid solution phases and includes both the single solution phase and the turbid, two solution phases. Although aqueous compositions where the above described phase transition temperature is near room temperature can be useful, preferred aqueous stripping compositions are those which have elevated phase transition temperatures, generally between about 120 and about 212° F. At such elevated temperatures, effects leading to dissolution, like diffusion and solubility, are increased and the time needed for stripping polymer masks is reduced.

Organic solvents useful in preparing aqueous stripping compositions of this invention are organic compounds normally useful in their undiluted state for removing polymers from substrates. Their unexpected usefulness in dilute aqueous stripping compositions reduces fire and toxic hazards associated with many such compounds and reduces expense, since the amount of the compound is significantly reduced. Organic solvents found particularly useful in this invention include 2-butoxyethanol, ethylene glycol mono-isobutyl ether, ethylene glycol mono-n-hexyl ether, 2-propoxy-propanol, 2-(2 - butoxyethoxy)ethanol, diethylene glycol mono-n-hexyl ether, ethylene diacetate, diethyl malonate, and furfural.

It has been found that stripping solutions used under the conditions described above are useful even without the addition of alkaline material and may therefore be handled with greater safety. Aqueous stripping solutions of the prior art, on the other hand, are usually highly alkaline in order to saponify the polymeric material to be removed. The process of the invention is also useful with alkaline stripping solutions, however, and it is in some cases desired to add a small quantity of an alkaline agent to make metallic substrates less susceptible to redeposition of polymer. In such cases there may be added up to about 10% by weight of alkaline agent, but generally only between 2 to 3% or less is desired. More than one alkaline agent can be used in a composition; however, total concentration would remain below about 10%. Alkaline agents particularly useful in compositions of the invention are ammonia, amines like monoethanol amine, diethanol amine, triethanol amine; alkali metal hydroxides, particularly sodium hydroxide; and basic salts like trisodium phosphate. Also useful are acid agents like phosphoric acid.

Surfactants when used comprise up to about 0.5% of the aqueous compositions. Surfactants particularly useful include materials positively charged, negatively charged and electrically neutral, e.g., isooctyl phenyl polyethoxy ethanol, sodium dodecylsulfate, sodium octadecylsulfonate, polyoxyethylene (20) sorbitan monopalmitate, stearyldimethylbenzyl ammonium chloride, alkyl polyoxyethylene glycol, N-cetyl and C-cetyl betaines, dioctyl sodium sulfosuccinate, alkylaminocarboxylates and dicarboxylates, and polyoxyethylene/polyoxypropylene block polymers.

In the process of this invention the mask of photohardened material adhered to the substrate is brought into intimate contact with the heated aqueous stripping composition by any of the well known methods, e.g., immersion, washing, spraying, etc., but the heated composition must remain in contact with the mask to insure thorough soaking usually between 30 seconds and 10 minutes. Although not essential, the substrate with adhered mask may be agitated in or scrubbed with the stripping composition. Also the element and aqueous stripping composition can be heated (or cooled) together to the phase transition temperature.

After soaking in the aqueous stripping composition the element is frequently washed, agitated or scrubbed in hot water by any of the well-known methods, e.g., brushing, scrubbing with saturated absorbent material, etc. Frequently the entire resist mask sloughs off the substrate intact as one piece facilitating removal from the hot water (or aqueous stripping solution when it occurs therein) and reducing contamination thereby permitting longer use of the water and reducing cleanup time.

Masks which can be removed by the process of this invention include photohardened materials such as colloids and polymers prepared from photopolymerizable compositions like those described in Plambeck, U.S. 2,760,863, Alles, U.S. 3,458,311, and U.S. 3,475,171, Celeste, U.S. 3,469,982, and Hurley et al., U.S. 3,622,334. The photohardened mask may also be prepared from photocrosslinkable and photodimerizable compositions like those described in Celeste, U.S. 3,526,504, Minsk et al., U.S. 2,670,286, Giangualano et al., U.S. 3,462,267, and in chapter 4 of "Light-Sensitive Systems" by Jaromir Kosar published by John Wiley & Sons., Inc., New York. The disclosures of the above-cited references are incorporated herein by reference. Besides the photohardened mask materials the process of this invention can also be used to remove polymer or colloid masks produced from other compositions and processes such as thermographic, photosolubilization, photodeactivation and the like. Such processes involve imaging with heat or radiant energy generally with one or more physical or chemical steps to produce masks. The process of this invention is also useful in removing heat hardened resist inks laid down by conventional screening processes.

The invention will be further illustrated by the following examples.

EXAMPLE I

A solution of a photosensitive material was prepared and coated on a 0.001-inch polyethylene terephthalate film similar to Example VII of Celeste, U.S. Pat. 3,469,982. After drying, the surface of the coating was laminated to a piece of clean 1 oz./sk. ft. copper-clad, epoxy fiber glass board using pressure rolls heated to 120° C. The copper surface of the board before lamination was cleaned by scouring with an abrasive cleaner, swabbing and thoroughly rinsing in water, and then dried with air jets. The photopolymerizable layer of the laminated element was exposed for 120 seconds through a printed circuit negative image bearing transparency and the film support in a vacuum printing frame at 27 inches vacuum at a distance of 18 inches from a carbon arc (a nuArc® Plate Maker of the flip-top type manufactured by the nuArc Co., Inc., Chicago, Ill.). The polyethylene terephthalate film was peeled from the exposed photopolymer layer which adhered to the copper surface and the unexposed areas of the layer were then dissolved away in a spray of 1,1,1-trichloroethane leaving a protective resist on the copper surface corresponding to the printed circuit. The element was then placed in a 42° Baumé ferric chloride solution until the copper was completely etched away in areas not covered by the resist image. The etched board was rinsed in water and dried leaving a resist covered copper conducting pattern on the fiber glass board. The element was immersed and agitated in an aqueous stripping composition at 140° F. having the following components:

| | | |
|---|---|---|
| 2-butoxyethanol (butyl Cellosolve®) | g | 100 |
| Monoethanol amine | g | 20 |
| Sodium hydroxide | g | 5 |
| Water | ml | 875 |

After 2 minutes immersion the resist separated from the copper surface essentially intact.

When the temperature of the aqueous stripping composition was raised from room temperature to 136° F., the solution became cloudy indicating formation of conjugate solutions. When the temperature of the composition was lowered to 130° F. turbidity disappeared and a clear solution appeared. The phase transition temperature was identified at 133° F.

EXAMPLE II

The following photoresist composition was prepared as below:

| | G. |
|---|---|
| Polymethylmethacrylate (inherent viscosity 1.20) | 10.4 |
| Polymethylmethacrylate (inherent viscosity 0.20) | 48.0 |
| Triethylene glycol diacetate | 8.2 |
| Trimethylolpropane triacrylate | 26.4 |
| 2-O-chlorophenyl-4,5-diphenylimidazolyl dimer | 5.68 |
| 4,4′-bis(dimethylamino) benzophenone | 1.0 |
| Benzotriazole | 0.2 |
| Victoria Pure Blue B.O. dye | 0.022 |

The photoresist composition was skim coated, laminated, exposed, developed and electroplated as described in Example I of Hurley et al., U.S. 3,622,334 to give a copper-clad epoxy fiber glass board having polymeric resist in exposed areas and plated copper in nonexposed areas. The plated copper surface was next plated with gold and then the polymeric resist was removed by the following stripping process.

An aqueous stripping composition which was a solution at room temperature and has a phase transition temperature of 160° F. was prepared as follows:

| | | |
|---|---|---|
| 2-butoxyethanol | g | 120 |
| Monoethanol amine | g | 20 |
| Water | ml | 860 |

The plated element with photopolymer resist mask in exposed areas was brought into intimate contact with the aqueous stripping composition heated to 160° F. by immersing the element in the composition for 1.5 minutes and then spraying the photopolymer surface with water at 135° F. for 1 minute. The photopolymer resist mask sloughed off the element essentially intact. The exposed copper was etched away in 42° Baumé ferric chloride and formed a suitable pattern plated printed circuit on the epoxy fiber glass board.

A second plated element with photopolymer resist in exposed areas was immersed in the stripping composition at room temperature for two hours and then sprayed with the room temperature water for one minute. The photopolymer mask still adhered to the copper surface after this treatment.

EXAMPLE III

A polyvinyl cinnamate resist composition was prepared as in Example I of Celeste, U.S. 3,526,504, and coated directly onto a copper-clad fiber glass board to a coating thickness of 0.0002 inch. As in that example the coating was exposed, developed for 5 seconds, and finally electroplated with a tin-lead alloy. The plated resist board was immersed in the aqueous stripping composition of Example I of this invention at 140° F. for 6 minutes and then brushed for several minutes with hot water (135° F.) until the crosslinked polyvinyl cinnamate mask was removed.

A printed circuit was produced upon etching the copper in areas not protected by the plated tin-lead alloy by using 25% by weight aqueous ammonium persulfate solution at 135° F. containing $10^{-3}$ moles mercuric chloride.

EXAMPLE IV

A photoresist composition was prepared, coated, and laminated to a copper-clad epoxy fiber glass board as in Example II. The element was exposed for 60 seconds through a process transparency on a nuArc® Plate Maker of the flip-top type using a xenon arc source Model No. FT–26L manufactured by the nuArc Co., Inc., Chicago, Ill. The exposed element was then developed for 60 seconds in a methyl chloroform spray.

The exposed element was immersed in a stripping composition heated to 160° F. and composed of 95 ml. water and 10 ml. 2-butoxyethanol. The photopolymer resist mask sloughed off within 130 seconds. When the concentration of 2-n-butoxyethanol was reduced below the phase transition concentration range (e.g., 95 ml. water and 5 ml. 2-n-butoxyethanol) stripping time of a similar exposed element at 160° F. increased to well beyond 5 minutes.

EXAMPLE V

A photosensitive composition was prepared, coated on an aluminum plate and exposed as in Example I of Alles, U.S. Pat. 3,475,171. The plate was developed by soaking in the following developer solution for 60 seconds, rubbing with a sponge and then rinsing with hot water.

Developer solution

| | | |
|---|---|---|
| 2-butoxyethanol | ml | 60 |
| Ethanolamine | g | 50 |
| Isooctyl-phenyl-polyethoxyethanol having from 9 to 10 ethoxy groups | g | 0.2 |
| Water to make 1 liter solution. | | |

After development the plate with a negative polymer mask was etched for two minutes using a ferric chloride etch and was then washed with ethylene glycol. Copper is then plated onto the etched aluminum areas by contacting the plate surface for 3 minutes with a solution containing

| | | |
|---|---|---|
| Cuprous chloride | g | 31 |
| Hydrochloric acid (37%) | ml | 32 |
| Ethylene glycol | ml | 1000 |

The plate was rinsed with ethylene glycol and then immersed in the following aqueous stripping composition at 140° F. for 2.5 minutes.

| | G. |
|---|---|
| 2-butoxyethanol | 90 |
| Sodium borate | 10 |
| Sodium dodecyl sulfate | 1 |
| Water to make 1000 ml. | |

The plate was then swabbed with the heated stripping composition until the polymer mask was removed from the aluminum plate. The resulting aluminum plate with the positive, copper plated image could be used as a planographic printing plate.

EXAMPLE VI

Plated elements with photopolymer resist in exposed areas, essentially the same as that described in Example II, were immersed in aqueous stripping compositions shown in the following table, after which they were sprayed with water heated to 120° F. In the table below, the ingredients added are in grams unless otherwise noted and sufficient water is added to make up one liter of aqueous composition.

| Component | Compositions | | |
|---|---|---|---|
| 2-butoxy ethanol | 70 | 110 | ---- |
| Diethyl malonate | | | 30 |
| Diethanol amine | | 20 | ---- |
| Triethanol amine | | | 15 |
| Ethylene dinitrilo-tetracetic acid tetra sodium salt | 13 | ---- | ---- |
| Use temperature (° F.) | 135 | 170 | 170 |
| Phase transition temperature (° F.) | 125 | 165 | ---- |
| Stripping time (minutes) | 4 | 2 | 3 |

The compositions containing 2-butoxy ethanol were solutions at room temperature and passed into two solution phases at their phase transition temperature determined as in Example I.

The aqueous stripping composition containing diethyl malonate was a solution at 170° F. When 7 g. of diethyl malonate were added, two phases formed. When 30 ml. water at the same temperature were added, a single solution formed. The phase transition concentration was identified as about 34 g. diethyl malonate per liter of composition at 170° F. concentration. The aqueous stripping composition was used within the temperature range indicated as use temperature. Although there were slight variations in stripping action, all the stripping compositions in the table were used satisfactorily to remove photopolymer resist mask from the plated element in the time given.

EXAMPLE VII

An aqueous stripping composition was prepared from 19 g. ethylene glycol diacetate and 81 ml. of water. The resulting composition formed two phases at room temperature and tended to separate into two layers. When heated to just above 155° F. with vigorous stirring a single homogeneous solution formed and when the single solution phase was cooled to just below 148° F. the solution turned cloudy and two phases formed. The phase transition temperature was assumed to be 152° F.

A plated element with photopolymer resist in exposed areas, essentially the same as that described in Example II, was immersed in the above aqueous stripping composition at 155° F. Within two minutes the photopolymer resist mask sloughed-off.

We claim:

1. A process of removing an organic solvent strippable polymer or colloid mask layer from a substrate comprising treating the layer with an aqueous stripping liquid containing between about 1 and 50% by weight of at least one partially miscible organic solvent, the temperature and solvent concentration of said stripping liquid being within 20° F. and 5% by weight, respectively, of the temperature and solvent concentration of the phase transition at which the liquid passes from a single solution phase to two conjugate solution phases.

2. A process according to claim 1 wherein said organic solvent is selected from 2-butoxyethanol, ethylene glycol mono-isobutyl ether, ethylene glycol mono-n-hexyl ether, 2-propoxy-propanol, 2-(2-butoxy-ethoxy)ethanol, diethylene glycol mono-n-hexyl ether, ethylene diacetate, diethyl malonate, and furfural.

3. A process according to claim 1 wherein said aqueous stripping liquid additionally contains a surfactant.

4. A process according to claim 1 wherein said aqueous stripping liquid additionally contains an alkaline agent.

5. A process according to claim 1 wherein the concentration of said organic solvent is between 2% and 25% by weight and the temperature of said stripping liquid is at least 120° F.

6. A process according to claim 7 wherein the step of treating comprises soaking the substrate with the mask adhered thereto in the stripping liquid and then removing the mask from the substrate by scrubbing the mask and substrate with hot water or stripping liquid.

7. A process according to claim 1 wherein said polymer or colloid mask layer is of photo-hardened material.

8. A process according to claim 7 wherein said aqueous stripping liquid additionally contains an alkaline agent.

9. A process according to claim 7 wherein the concentration of said organic solvent is between 2% and 25% by weight and the temperature of said stripping liquid is at least 120° F.

10. A process according to claim 7 wherein said organic solvent is selected from 2-butoxyethanol, ethylene glycol mono-isobutyl ether, ethylene glycol mono-n-hexyl ether, 2-propoxy-propanol, 2-(2 - butoxy-ethoxy)ethanol, diethylene glycol mono-n-hexyl ether, ethylene diacetate, diethyl malonate, and furfural.

References Cited

UNITED STATES PATENTS 3,536,529 10/1970 Fiocco ............... 134—40
3,553,144 1/1971 Murphy ............ 252—170 X
3,592,691 7/1971 Stelter ............ 252—170 X
3,673,099 6/1972 Corby et al. ....... 252—158 X

OTHER REFERENCES

Mellan: Industrial Solvents, Reinhold Publishing Corp., New York, 1950, pp. 573, 643–645, 651.

MORRIS O. WOLK, Primary Examiner
T. W. HAGAN, Assistant Examiner

U.S. Cl. X.R.

134—42; 252—158, 173, 364